United States Patent
Derby

(10) Patent No.: US 6,519,738 B1
(45) Date of Patent: Feb. 11, 2003

(54) METHOD AND APPARATUS FOR HIGH-SPEED CRC COMPUTATION BASED ON STATE-VARIABLE TRANSFORMATION

(75) Inventor: Jeffrey Haskell Derby, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/520,261

(22) Filed: Mar. 7, 2000

(51) Int. Cl.$^7$ ............................................. H03M 13/09
(52) U.S. Cl. .................... 714/781; 714/757; 714/807
(58) Field of Search ................. 714/781, 757, 714/807

(56) References Cited

U.S. PATENT DOCUMENTS

| | | | |
|---|---|---|---|
| 3,798,597 A | * 3/1974 | Frambs et al. ............... | 714/781 |
| 4,473,902 A | 9/1984 | Chen ........................... | 714/759 |
| 4,593,393 A | 6/1986 | Mead et al. ................. | 714/757 |
| 5,103,451 A | 4/1992 | Fossey ........................ | 714/757 |
| 5,132,975 A | 7/1992 | Avaneas ..................... | 714/757 |
| 5,282,214 A | * 1/1994 | Dravida ....................... | 714/757 |
| 5,870,413 A | 2/1999 | Kodama et al. ............. | 714/758 |
| 5,898,712 A | 4/1999 | Kodama et al. ............. | 714/807 |
| 5,931,967 A | * 8/1999 | Shimizu et al. .............. | 714/799 |

* cited by examiner

Primary Examiner—Stephen M. Baker
(74) Attorney, Agent, or Firm—Scott W. Reid

(57) ABSTRACT

A method, and a system for employing the method, for computing a cyclic redundancy code (CRC) of a communication data stream taking a number of bits M at a time to achieve a throughput equaling M times that of a bit-at-a-time CRC computation operating at a same circuit clock speed. The method includes (i) representing a frame of the data stream to be protected as a polynomial input sequence; (ii) determining one or more matrices and vectors relating the polynomial input sequence to a state vector; and (iii) applying a a linear transform matrix for the polynomial input sequence to obtain a transformed version of the state vector. The method can further include (iv) applying a linear transform matrix to the transformed version of the state vector to determine a CRC for the polynomial input sequence, if the communication data stream is received by a network device. The method can further include (v) appending the CRC as a frame check sequence (FCS) to the communication data stream for detection by a receiving device.

24 Claims, 5 Drawing Sheets $$A = \begin{bmatrix} 0000000000000000000000000000001 \\ 1000000000000000000000000000001 \\ 0100000000000000000000000000001 \\ 0010000000000000000000000000000 \\ 0001000000000000000000000000001 \\ 0000100000000000000000000000001 \\ 0000010000000000000000000000000 \\ 0000001000000000000000000000001 \\ 0000000100000000000000000000001 \\ 0000000010000000000000000000000 \\ 0000000001000000000000000000001 \\ 0000000000100000000000000000001 \\ 0000000000010000000000000000001 \\ 0000000000001000000000000000000 \\ 0000000000000100000000000000000 \\ 0000000000000010000000000000000 \\ 0000000000000001000000000000000 \\ 0000000000000000100000000000001 \\ 0000000000000000010000000000000 \\ 0000000000000000001000000000000 \\ 0000000000000000000100000000000 \\ 0000000000000000000010000000000 \\ 0000000000000000000001000000000 \\ 0000000000000000000000100000001 \\ 0000000000000000000000010000001 \\ 0000000000000000000000001000000 \\ 0000000000000000000000000100000 \\ 0000000000000000000000000010000 \\ 0000000000000000000000000001000 \\ 0000000000000000000000000000100 \\ 0000000000000000000000000000010 \end{bmatrix}$$

$$A^M = \begin{bmatrix} 0000010011010001000000011101111 \\ 1100001101011100110000001001000 \\ 1110001111000110111000001010011 \\ 0111000111100011011100000101001 \\ 1011101010011001001110001100011 \\ 1101111100100100000111100100011 \\ 0110111110010010000011100100011 \\ 1011010110100001100001111100110 \\ 1101100010111000010000110000100 \\ 0110110001011100001000011000010 \\ 1011010001000110100100000010110 \\ 1101100001001011110010001111100 \\ 1110111oa1001101011001001001001 \\ 0111011100100110101100100100100 \\ 0011101110010011010110010010010 \\ 0001110111001001101011001001001 \\ 1000110010001100010101101010011 \\ 0100011001000110001010110101001 \\ 0010001100100011000101011010100 \\ 0001000110010001100010101101010 \\ 0000100011001000110001010110101 \\ 0000010001100100011000101011010 \\ 1000000010110101011000110110101 \\ 1100001001000101111011000001101 \\ 0110000100100010111011000001101 \\ 0011000010010001011101100000110 \\ 1001101000100000011101111101001 \\ 0100110100010000001110111110100 \\ 0010011010001000000111011111010 \\ 0001001101000100000011101111101 \\ 0000100110100010000001110111110 \\ 0000010011010001000000111011111 \end{bmatrix}$$

FIG. 3A $$W_2 = \begin{bmatrix} \text{matrix of binary digits} \end{bmatrix}$$

FIG. 3B $$W_2^{-1} = \begin{bmatrix} \text{matrix of binary digits} \end{bmatrix}$$

METHOD AND APPARATUS FOR HIGH-SPEED CRC COMPUTATION BASED ON STATE-VARIABLE TRANSFORMATION

The following related patent document of common assignee and inventorship is incorporated herein by reference in its entirety:

U.S. Patent Application entitled "Computing The CRC M Bits At A Time For Data Whose Length In Bits Is Not A Multiple Of M," filed Mar. 7, 2000, Ser No. 09/520, 048.

REFERENCES

The following references, which are incorporated herein by reference in their entirety, are referenced in the remainder of this patent document:

[1] ISO 3309, Information processing systems Data communication High-level data link control procedures Frame structure, 1984.
[2] W. W. Peterson and D. T. Brown, Cyclic codes for error detection, Proc. IRE, vol. 49, pp. 228–235, January 1961.
[3] R. E. Blahut, Theory and Practice of Error Control Codes. Reading, Mass. : Addison-Wesley, 1983.
[4] IBM Corporation, Synchronous Data Link Control Concepts, GA27-3093-3, June 1986.
[5] A. M. Patel, A multi-channel CRC register, in AFIPS Conference Proceedings, vol. 38, pp. 11–14, Spring 1971.
[6] A. Perez, Byte-wise CRC calculations, IEEE Micro, vol. 3, pp. 40–50, June 1983.
[7] G. Albertengo and R. Sisto, Parallel CRC generation, IEEE Micro, vol. 10, pp. 63–71, October 1990.
[8] T-B. Pei and C. Zukowski, High-speed parallel CRC circuits in VLSI, IEEE Trans. Commun., vol. 40, pp. 653–657, April 1992.
[9] R. J. Glaise and X. Jacquart, Fast CRC calculation, in Proc. 1993 IEEE Intl. Conf. on Computer Design: VLSI in Computers and Processors, Cambridge, Mass., pp. 602–605, October 1993.
[10] S. L. Ng and B. Dewar, Parallel realization of the ATM cell header CRC, Computer Commun., vol. 19, pp. 257–263, March 1996.
[11] M. Braun et.al., Parallel CRC computation in FPGAs, in Proc. 6th Intl. Workshop on Field Programmable Logic and Applications, Darmstadt, Germany, pp. 156–165, September 1996.
[12] S. Li and J. A. Pasco-Anderson, Efficient CRC remainder coefficient generation and checking device and method, U.S. Pat. No. 5,619,516, Apr. 8, 1997.
[13] R. J. Glaise, A two-step computation of cyclic redundancy code CRC-32 for ATM networks, IBM J. Res. Devel., vol. 41, pp. 705–709, November 1997.
[14] ITU-T Rec. I.432, B-ISDN User-Network Interface Physical Layer Specifications, pp. 16–20, March 1993.
[15] J. J. D Azzo and C. H. Houpis, Linear Control System Analysis and Design. New York: McGraw-Hill, 1981.
[16] K. Hoffman and R. Kunze, Linear Algebra. Englewood Cliffs, N.J.: Prentice Hall, 1971.

BACKGROUND OF THE INVENTION

1. Field of the Invention

The following invention relates generally to error detection in a telecommunications environment and specifically to speeding up cyclic redundancy code (CRC) calculations to speed up error detection.

2. Related Art

The cyclic redundancy code (CRC) of a block of data, which is also called a frame check sequence (FCS), provides a standard technique for error detection in communication networks. The block of data to be protected is represented as a polynomial whose coefficients are all either 0 or 1. The frame check sequence, or CRC, is essentially the remainder resulting from the division of this polynomial by the CRC's generator polynomial.

The use of a cyclic redundancy check, or CRC, is a standard means for error detection in communication networks. A block, or frame, of binary data to be protected is represented as a polynomial over GF(2), the field of integers modulo 2. Computation of the CRC is defined in terms of division of this polynomial by a so-called generator polynomial, with the division carried out using arithmetic in GF(2). The CRC is appended to the data frame before transmission as a frame-check sequence, and is checked at the receiving end using an essentially identical polynomial division process.

The reference implementations of CRC calculation are based on a shift register with feedback that processes the input data one bit at a time. With the advent of communication interfaces operating at speeds greater than 100 Mbits/s, it has been found advantageous to design circuitry for parallel CRC computation, i.e., that operates on eight or more bits at a time. Ideally, an implementation that processes M bits at a time can achieve a full M-times speed-up, meaning that its throughput should be M times that of a bit-at-a-time implementation. In fact, all of the reported implementations to date achieve only partial speed-up.

The terms cyclic redundancy check (CRC) and frame check sequence (FCS) can be used synonymously, or can be related to one another. Technically, FCS refers to the CRC (or derivation thereof) when it is appended to the data transmission at the transmitting end to ensure that there has been a reliable transmission at the receiving end.

A formal definition of the CRC employed in data communication applications is given in a number of communication standards. The International Standards Organization (ISO) definition of a CRC is defined as follows: the K-bit frame-check sequence (where K is the bit length of the CRC) must be the ones complement of the modulo 2 sum: (a) the remainder of $z^N \cdot U_0(z)$ divided (modulo 2) by the generator polynomial G(z), where the number of bits in the input sequence to be protected by the CRC is N, and $U_0(z)$ is an initialization polynomial of degree less than K; and (b) the remainder of $z^K \cdot U_p(z)$ divided (modulo 2) by the generator polynomial G(z), where $U_p(z)$ is the polynomial representing the input sequence to be protected by the CRC. (Hereinafter, K is used to refer to the bit length of the CRC.)

For purposes of the present invention, the term CRC is be used to refer to the sum of the two remainders referred to in the definition above. The FCS that is appended to the data frame is equal to the ones complement of what is referred to as CRC in the present invention. In GF(2), finding the ones complement of a number is equivalent to adding 1 to the number.

The input sequence is a time series u(n) that takes on values 0 or 1, with time index n, starting from 0 (such that u(0) is the first bit to be processed), and the polynomial representation referred to in the CRC definition is:

$$U_p(z) = \sum_{n=0}^{N-1} u(n) z^{N-1-n}. \qquad (1)$$

The generator polynomial G(z) is a polynomial of degree K. The ISO standard generator polynomials for K=16 and K=32 are (see reference [1], for example):

$$G_{16}(z)=z^{16}+z^{12}+z^5+1$$

$$G_{32}(z)=z^{32}+z^{26}+z^{23}+z^{22}+z^{16}+z^{12}+z^{11}+z^{10}+z^8+z^7z^5+z^4+z^2+z+1 \quad (2)$$

The initialization polynomial is generally either zero or the polynomial of degree K−1 all of whose coefficients are 1.

The error detection properties of the CRC depend on the characteristics of polynomials over the field GF(2), are well known (see reference [2], for example), and are not an issue in the present disclosure. Rather, the present invention addresses efficient means for high-speed CRC computation.

The reference implementation for computing the CRC is derived from a circuit for polynomial division that employs a shift register with feedback (see reference [3], for example), although other methods recognized by skilled artisans are also available.

One form of this reference implementation, generalized from reference [4], is shown in FIG. 1. The blocks labeled $z^{-1}$ are unit delay elements that make up the shift register. For the block whose output is $X_K(n)$, for example, the input is equal to $X_K(n+1)$. The scale factors of the gain elements are the coefficients of the divisor polynomial G(z); i.e., $$G(z) = \sum_{k=0}^{K} g_k z^k \quad (3)$$

where the coefficients are assumed to be normalized with $g_K=1$. The input sequence contains the finite-length block of data to be protected, for n=0, 1, ..., N−1. After the last element of the input sequence has been processed, i.e., at n=N, the shift register contains the remainder of the division required by the CRC definition. More precisely, letting the shift register be initialized so that its contains a representation of the initialization polynomial $U_o(Z)$; i.e., if $$U_o(z) = \sum_{k=0}^{K-1} u_{ok} z^k \quad (4)$$

then set $x_k(0)=u_{ok}$ for K=0, 1, ..., K−1. Then, at n=N, the contents of the shift register represents the sum of the remainder of $z^N U_o(z)$ divided by G(z), and the remainder of $z^K U_p(z)$ divided by G(z), where $U_p(z)$ is the polynomial representation of the input data sequence according to Eqn. (1). In other words, if the sum of these two remainders is called $R_T(z)$, with $$R_T(z) = \sum_{k=0}^{K-1} r_{Tk} z^k \quad (5)$$

then the coefficients of this polynomial, which make up the CRC, satisfy:

$$r_{Tk}=x_k(N); k=0, 1, \ldots, K-1 \quad (6)$$

When the CRC is computed over GF(2) as in the standard definition, the appropriate arithmetic is employed. Thus the summing blocks in FIG. 1 implement modulo 2 addition, and the negative signs in the figure are irrelevant (because any element in GF(2) is its own additive inverse). In addition, since the coefficients of G(z) are all either 0 or 1, the gain elements shown in the figure would be implemented either as a closed connection (for a 1) or an open circuit (for a 0).

The processing of the input sequence in FIG. 1 can be described by the difference equation:

$$x(n+1)=Ax(n)+bu(n) \quad (7)$$

where the K-dimensional state vector x(n) is $$x(n)=[x_0(n) x_1(n) \ldots x_{K-1}(n)]^T \quad (8)$$

A is a K×K matrix with the form $$A = \begin{bmatrix} 0 & 0 & \cdots & 0 & 0 & -g_0 \\ 1 & 0 & \cdots & 0 & 0 & -g_1 \\ 0 & 1 & \cdots & 0 & 0 & -g_2 \\ \cdots & \cdots & \cdots & \cdots & \cdots & \cdots \\ 0 & 0 & \cdots & 1 & 0 & -g_{k-2} \\ 0 & 0 & 0 & 0 & 1 & -g_{k-1} \end{bmatrix} \quad (9)$$

and b is the K×1 matrix $$b=[(-g_0)(-g_1) \ldots (-g_{K-1})]^T \quad (10)$$

where the superscript "T" indicates "transpose." The initial condition for the difference equation (7) is determined by the initialization polynomial; with $U_o(z)$ as in Eqn. (4):

$$x_k(0)=u_{ok}; k=0, 1, \ldots, K-1 \quad (11)$$

Again, when the CRC is computed over GF(2), the calculation in Eqn. (7) is done using modulo-2 arithmetic, and the negative signs in the A matrix in Eqn. (9) are superfluous. Note also that the shift register contains the CRC. In other words, the state vector of the system described by the state equation (7) is equal to the CRC after the last input element has been processed, at n=N.

Finally, we observe that Eqn. (7) is executed once for each element of the input sequence (i.e., for each bit of the input bitstream), Given the structure of the A matrix, the operations that must be performed per input element are two adds and a shift of the register; this is also evident from FIG. 1. For a bitstream to be transmitted to or received from a communication interface, with the CRC computed in GF(2) using modulo-2 arithmetic, the circuitry in FIG. 1 must be able to complete two exclusive-or operations and one register shift within a single bit-time. For an interface operating at 100 Mbits/s, for example, this time is 10 nsec, while the time available is 1 nsec for an interface operating at 1 Gbit/s.

Consider some integrated circuit technology in which the net time through two exclusive-or operations and a register is 2 nsec. Clearly, either an even faster integrated circuit technology or some other approach to CRC computation is needed for interfaces at 1 Gbit/s (for example, the so-called gigabit Ethernet). In fact, there are already communication interfaces operating at speeds in excess of 2 Gbits/s (for example, SONET OC48 at about 2.4 Gbits/s, and 10 Gbits/s Ethernet); for these, a different approach seems mandatory. At the same time, techniques for computing the CRC that can operate at lower clock speeds for a given interface speed can be realized using circuits that sacrifice speed in favor of lower power. In general, then, such techniques are mandatory for some cases and may provide important advantages even when they are not mandatory.

Known techniques for high-speed CRC computation have focused on processing some number of bits (i.e., elements of the input sequence u(n)) in parallel. This approach was originally described by Patel [5]. Perez [6] has an early example of its implementation in software. References [7] through [13] provide other examples of hardware implementations of parallel CRC computation.

The basis of all reported techniques for parallel CRC computation can be established by describing formally the block-oriented version of the system state equation (7). Let the elements of the input sequence be grouped into blocks of length M, so that the input to the block-oriented system is now a vector $u_M(m)$ with $$u_M(m)=[u(mM=M-1)u(mM+M-2)\ldots u(mM-1)u(mM)]^T; m=0, 1\ldots, (N/M)-1 \quad (12)$$

assuming that N is an integral multiple of M. It is well known that the state equation (7) can be rewritten as:

$$x(m+1)=A^M x(m)+B_M u_M(m) \quad (13)$$

where the index m is incremented by one for each block of M input elements. The K×K matrix $A^M$ in Eqn. (13) is equal to the A matrix in Eqn. (9) multiplied by itself M times. The matrix $B_M$ is a K×M matrix whose columns are found by multiplying the vector b in Eqn. (7) by successively higher powers of A; for $M \leq K$, the columns of $B_M$ are the M rightmost columns of $A^M$.

The initial condition for the difference equation (13) is given by Eqn. (11); it is identical to that for the original difference equation. Additionally, the state vector contains the CRC after the last block of M input elements has been processed, assuming that N is an integral multiple of M.

In the case of block-oriented, or parallel, CRC computation, the computation of x(m+1) from x(m) following Eqn. (13) must complete within the time associated with transmission or reception of M input elements, i.e., within M bit-times. If the net computation associated with Eqn. (13) is no more complex than the net computation associated with Eqn. (7), then we would say that the block-oriented system represented by Eqn. (13) provides a speed-up by a factor of M; in other words, for the same speed circuitry, the throughput of the system represented by Eqn. (13) is M times that of the system represented by Eqn. (7).

With the exception of [13], all of the referenced known techniques work directly with the block-oriented state equation (13). They take advantage of one particular characteristic of the structure of the matrices in this equation, namely that for $M \leq K$, the columns of $B_M$ are the M rightmost columns of $A_M$, as noted above, and then employ either a table-lookup approach or an optimized exclusive-or array to carry out the computation indicated in (13). Pei and Zukowski [8], for example, investigate the trade-offs between achievable speed-up and the size and complexity of the exclusive-or array for different CRC polynomials; the maximum speed-up they are able to achieve using their approach is a factor of about M/2. Ng and Dewar [10] find a similar limit for the special case of the 8-bit CRC used to protect ATM cell headers in ATM networks [14].

In [13], Glaise outlines an approach to high-speed CRC computation that is different from the other referenced techniques in several respects but still has one key property in common with them. In Glaise's approach, the polynomial representing the input data sequence is divided not by G(z), but rather by a polynomial of much higher degree that has G(z) as a factor. The remainder polynomial from this first division is then divided by G(z), and the remainder of the latter division is the desired CRC. Both divisions are carried out using block-oriented processes that can be described using a form of the block state equation (13); the first division is carried out by processing 8 input bits at a time (i.e., with M=8), while the second is carried out in one step with M equal to the degree of the first divisor polynomial. This approach provides speed-up when the first divisor polynomial is selected to have certain properties, as described in [13]; the polynomial used in [13] has degree 123 with 8 non-zero coefficients. It is claimed in [13] that the time to process each group of 8 input bits for the first division can be as low as 10 nsec; unfortunately, there is no point of reference for bit-at-a-time processing or per-gate delays, so the speed-up factor achieved cannot be estimated. Even if a full speed-up factor of 8 were achievable here, the technique suffers from a major disadvantage, namely that given G(z), a good divisor polynomial for the first division can be found only by exhaustive search (as stated in [13]); in other words, there is no general method here. Note also that the technique in [13] shares one key property with all the other known referenced material, namely: the remainder of each division, and thus the CRC as well, is identical to the state vector x in the block state equations (13).

Finally, it is important to keep in mind that in most practical data-communication systems the length N of the data sequences for which CRCs are computed is an integral multiple of 8, so that M=8 is a common value for block CRC computation. Since N is in general not guaranteed to be an integral multiple of any larger number (16, for example), use of a value of M larger than 8 requires some postprocessing to complete the computation of the CRC. This postprocessing is required for all known techniques and also for the invention described here. While several references have presented results for M>8 (see [8], for example), not one has discussed the postprocessing required for these cases. The present disclosure also ignores the postprocessing required for these cases, essentially assuming that N is an integral multiple of M. A companion patent document, the U.S. Patent Application entitled "Computing The CRC M Bits At A Time For Data Whose Length In Bits Is Not A Multiple Of M," (listed under the references section above, incorporated herein by reference in its entirety, and referenced hereinafter as "companion patent-document"), describes a novel postprocessing technique for cases with N not an integral multiple of M.

To summarize the key properties of all known techniques for fast CRC calculation that are known to the author: (1) All techniques have the CRC as the state vector in a state representation of the division process, using Eqns. (7) or (13); (2) No known technique (with the possible exception of that in [13]) achieves a speed-up factor greater than about M/2, processing blocks of M input bits at a time; (3) No known technique (including that in [13]) includes a method that guarantees a full speed-up factor of M, processing blocks of M input bits at a time, for arbitrary generator polynomials G(z). These problems are solved by the present invention.

SUMMARY OF THE INVENTION

The present invention is directed to a method, and a system for computing a cyclic redundancy code (CRC) of a communication data stream taking a number of bits M at a time to achieve a throughput equaling M times that of a bit-at-a-time CRC computation operating at a same circuit clock speed. The method includes (i) representing a flame of the data stream to be protected as a polynomial input sequence; (ii) determining one or more matrices and vectors relating the polynomial input sequence to a state vector; and (iii) applying a a linear transform matrix for the polynomial input sequence to obtain a transformed version of the state vector. The method can further include (iv) applying a linear transform matrix to the transformed version of the state vector to determine a CRC for the polynomial input sequence, if the communication data stream is received by a network device. The method can further include (v) appending the CRC as a frame check sequence (FCS) to the communication data stream for detection by a receiving device.

The polynomial input sequence u(n) can be defined in the field of integers modulo 2 (GF(2)), and the steps (i)–(v) can be performed in GF(2). Step (i) can include grouping the elements of the input sequence into blocks of length M; and representing the input sequences in a block oriented fashion as $u_M(m_{max}) = [u(mM+M-1) \; u(mM+M-2) \; \ldots \; u(mM+1) \; u(mM)]^T$, where $m = 0, 1, \ldots, m_{max}$, where $m_{max}$ equals $(N/M) - 1$.

In step (ii), the state vector can be represented by $x(m+1) = A^M x(m) + B_M u_M(m)$, where A is a K×K matrix containing the coefficients of a CRC generator polynomial, where K is the dimension of G(z), where b is a K dimensional vector containing one or more coefficients of a CRC generator polynomial, where $B_M$ is a K×M matrix whose columns are determined by multiplying b by successively higher powers of A, and where $u_M(m)$ is a block oriented version of the input sequence.

Step (ii) can further include (a) determining a matrix A and a vector b from a CRC generator polynomial (G(z)) of degree K; and (b) determining a matrix $A^M$ and a matrix $B_M$ respectively from the matrix A and the vector b, where A is a K×K matrix containing the coefficients of the CRC generator polynomial, where K is the dimension of G(z), where b is a K dimensional vector containing one or more coefficients of the CRC generator polynomial, and where $B_M$ is a K×M matrix whose columns are determined by multiplying b by successively higher powers of A.

The matrix A, for example, can equal the matrix $$A = \begin{bmatrix} 0 & 0 & \cdots & 0 & 0 & -g_0 \\ 1 & 0 & \cdots & 0 & 0 & -g_1 \\ 0 & 1 & \cdots & 0 & 0 & -g_2 \\ \cdots & \cdots & \cdots & \cdots & \cdots & \cdots \\ 0 & 0 & \cdots & 1 & 0 & -g_{k-2} \\ 0 & 0 & 0 & 0 & 1 & -g_{k-1} \end{bmatrix}$$

where $-g_0, -g_1, -g_2, \ldots -g_{k-1}$ are coefficients of the CRC generator polynomial. The vector b can equal $[g_0, g_1, g_2, \ldots g_{k-1}]$. The matrix $B_M$ can equal $[b \; Ab \; A^2 b \; \ldots \; A^{M-1} b]$.

Step (iii) can include (a) determining a characteristic polynomial H(z) of $A^M$ over the field of integers modulo 2 (GF(2)); (b) determining a companion-form matrix $A_{Mt}$ whose characteristic polynomial is H(z); and (c) calculating the linear transform matrix T for the input sequence from $A^M$ and $A_{Mt}$. The method can include: (a) if M is a power of 2, then determining $A^M$ to have the same characteristic polynomial as A, such that H(z) equals G(z); (b) if M is not a power of 2, then calculating H(z) for $A^M$ by applying ordinary arithmetic and determining H(z) to have the coefficients of an interim characteristic polynomial evaluated modulo 2. The method can also include (a) calculating the linear transform matrix T as the product of a matrix $W_2$ and a second matrix $W_1^{-1}$, where $W_1 = [b_1 \; A_{Mt} b_1 \; A_{Mt}^2 b_1 \; \ldots \; A_{Mt}^{K-1} b_1]$, where $W_2 = [b_2 \; A^M b_2 \; A^2 M b_2 \; \ldots \; A^{(K-1)M} b_2]$, (1)(i) where if H(z) is irreducible, then $b_1$ can equal any vector other than the all-zero vector, (1)(ii) where if H(z) is not irreducible, then $b_1$ is derived by the product of (z+1), where z is a transform variable, and an irreducible polynomial $H_1(z)$ of degree K–1, where the matrix products of $H_1(A_{Mt}) b_1$ and $(A_{Mt} + I_K) b_1$ are both non-zero in value, where I is an identity K×K dimensional matrix, (1)(iii) where if H(z) is irreducible, then $b_2$ can equal any vector other than the all-zero vector, and (1)(iv) where if H(z) is not irreducible, then $b_2$ is derived by the product of (z+1) and an irreducible polynomial $H_2(z)$ of degree K–1, where the matrix products of $H_2(A^M) b_2$ and $(A^M + I_K) b_2$ are both non-zero in value; and (2) computing $W_1^{-1}$ as the inverse of $W_1$ over GF(2).

Finally, the transformed version of the state vector can be defined by the equations $x_t(m+1) = A_{Mt} x_t(m) + B_{Mt} u_M(m)$, and $y(m) = C_{Mt} x_t(m)$, where m is an integer; and where step (iv) above includes determining the CRC by applying the equations $A_{Mt} = T^{-1} A^M T$, $B_{Mt} = T^{-1} B_M$, $C_{Mt} = T$, and the initial condition $x_t(0) = T^{-1} x(0)$ to the transformed version of the state vector until y(m) equals y(N/M), where N is the length of the input sequence, and where $T^{-1}$ is the transverse of the linear transform matrix T.

BRIEF DESCRIPTION OF THE FIGURES

The present invention will be described with reference to the accompanying drawings, wherein:

FIGS. 3A and 3B illustrate matrices $W_2$ and $W_2^{-1}$, used to compute a matrix T, which in turn is used to achieve full speed up for a high-speed CRC circuit, for the same example as in FIGS. 2A and 2B;

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

I. Summary of the Present Invention

Figures 1, 2A, 2B:
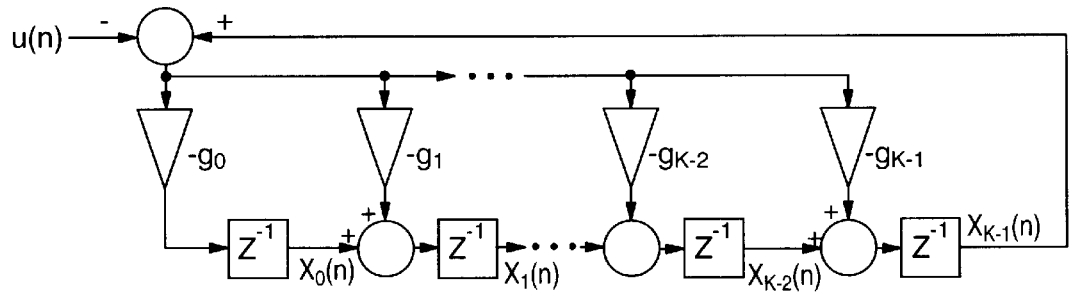
FIG. 1 illustrates reference implementation for computing a cyclic redundancy code (CRC)
FIGS. 2A and 2B illustrate matrix A having gain coefficients for a CRC circuit as its rightmost elements, and $A^M$, which is A raised to the exponent M, where M represents blocks of equal length into which an input sequence u(n) is divided, for an example using the standard 32-bit CRC polynomial M=32.

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The CRC is a standard technique for error detection in communication networks. A block of data to be protected is represented as a polynomial whose coefficients are all either 0 or 1. The frame check sequence, or CRC, is essentially the remainder resulting from the division of this polynomial by the CRC s generator polynomial.

Reference implementations of CRC calculation are based on a shift register with feedback that processes the input data one bit at a time. With the advent of communication interfaces operating at speeds greater than 100 Mbits/s, it has been found advantageous to design circuitry for parallel CRC computation, i.e., that operates on eight or more bits at a time.

Ideally, an implementation that processes M bits (where M is the length of the data block itself) at a time should achieve a full M-times speed-up, i.e., its throughput should be M times that of a bit-at-a-time implementation. In fact, however, the reported implementations to date achieve only partial speed-up.

The present invention describes a technique for realizing a full M-times speed-up in computing a CRC M bits at a time. For example, in a technology that can support bit-at-a-time CRC calculation at a maximum throughput of 250 Mbits/s, the disclosed technique achieves a throughput of 2 Gbits/s with M=8 and 8 Gbits/s with M=32, with the circuits clocked at 250 MHz.

The present invention employs a linear transformation applied to the equations for parallel CRC computation, such that the circuitry in the critical timing path is equivalent to that for bit-at-a-time CRC computation. The method, and system for applying the method, are general and can be applied for any CRC generator polynomial with computation over the field of integers modulo 2.

To summarize, the inventive technique provides for computing the CRC of a data sequence, taking M bits at a time. This technique provides a throughput equal to M times that of the bit-at-a-time CRC computation operating at the same circuit clock speed; alternatively, it provides the same throughput of the bit-at-a-time CRC computation but with the circuit clock speed reduced by a factor of M. This represents an improvement of at least a factor of 2 over known techniques for high-speed CRC computation known to the inventor.

II. Introduction to the Present Invention

While any speed-up is useful, the value of achieving a full speed-up could be evaluated in the context of the example outlined above. Of course, each generation of CMOS and other integrated circuit technology is faster, but the speed of new communication interfaces also keeps increasing. In fact, the value of achieving full speed-up will be evident from the following considerations:

(1) For a given circuit technology speed, a CRC implementation that guarantees full speed-up can provide at least twice the throughput of any known technique.

(2) Alternatively, for a given throughput (i.e., a communication interface at a given speed), a CRC implementation that guarantees full speed-up can operate at a circuit clock speed at or below one half that of any known technique, and thus permits implementation with lower power circuitry.

(3) For any M, it does not appear possible to perform a step of the difference equation required to update the CRC with fewer operations than two adds and a register shift. In other words, given M, a full speed-up of M represents an upper bound on the throughput for a given clock speed. An implementation that achieves this full speed-up thus represents the most efficient implementation possible in terms of computation time required per step.

The present invention to be described in detail in the next section differs from all known techniques in that it does provide a full speed-up factor of M, processing blocks of M input bits at a time, and includes a simple method for realizing this speed-up for arbitrary generator polynomials $G(z)$. It is possible with this technique, for example, to achieve a speed-up factor of 32 in computing the 32-bit CRC taking 32 bits at a time; in a technology that can support bit-at-a-time CRC calculation at 250 Mbits/s, the disclosed technique achieves a throughput of 2Gbits/s with M=8 and 8 Gbits/s with M=32, with the CRC calculation circuits clocked at 250 MHz. When combined with the postprocessing technique described in the companion patent document, this performance can be achieved for N equal to any integral multiple of 8 bits and with essentially zero inter-arrival time between data sequences to be processed.

An important novel aspect of the invention is that the CRC is not contained in the state vector of a state representation of the division process. Rather, the state equations (13) are evaluated in a transformed state space, and the CRC is computed as a linear transformation of the state vector x.

It should be noted that state-space transformation is a known technique that is often used in the design of feedback control systems (see, for example, Chapters 5 and 17 in [15]). The object of transforming the state vector in these applications is usually to modify the time-domain or frequency-domain response of the system so that certain design criteria are met. In this invention, the object of the state-space transformation is to reduce the computation required to update the state vector (actually, the transformed state vector) in the block-oriented equations (13) for every M input bits so that it is no greater than that required to update the state vector in the bit-at-a-time equations (7), thus yielding a full speed-up factor of M. The design of the transformation here thus follows a different path than that taken for the transformations generally employed in feedback control systems. In addition, we take advantage of the properties of matrices such as that in Eqn. (9) over the field GF(2).

III. An Overview of the Solution Provided by the Present Invention

Our solution the problem of achieving optimum high-speed CRC computation with full speed up starts with the block state equation (13). We define an output vector $y(m)$ and add to the block state equation an output equation that relates the output vector to the state vector. This enables consideration of the CRC as an output of the system that is different from the state vector. The complete block state equations are $$x(m+1)=A^M x(m)+B_M u_M(m)$$

$$y(m)=C_M x(m) \quad (14)$$

Since we want the output vector to contain the CRC, we have $y(m)$ as a K-dimensional vector. In addition, since at this point, with the state equation exactly as in Eqn. (13), the CRC is equal to the state vector, so the matrix $C_M$ in Eqns. (14) is equal to $I_K$, the K×K identity matrix.

Looking carefully at Eqns. (14), we see that the only computations that must be completed within a time interval constrained by the speed of the communication interface are: (a) the product $A^M x(m)$; and (b) the addition to this product of the result $B_M$ $u_M(m)$. Evaluation of the products $B_M$ $u_M(m)$ and $C_M x(m)$ can take as much time as necessary, through the use of pipelining, so long as the net delay that results in the data path is acceptable. The speed-up provided by known solutions has been limited by the complexity of the matrix $A^M$ compared with that of A.

We consider now a linear transformation of the state vector through a constant, non-singular matrix T; i.e., $$x(m)=Tx_t(m) \tag{17}$$

Note that T and its inverse are both matrices over GF(2). Note also that the inverse of a non-singular matrix over GF(2) can be found in the "usual way", that is as the adjoint of the matrix divided by its determinant. The elements of the adjoint of a matrix, as well as its determinant, are sums of products of the elements of the matrix; these sums of products are easily evaluated using modulo 2 arithmetic in finding the inverse matrix.

Given T and its inverse, the block state equations (14) are rewritten so that the evolution of the output sequence $y(m)$ based on the block input sequence $u_M(m)$ is expressed in terms of the evolution of the transformed state vector $x_t(m)$, as follows:

$$x_t(m+1) = A_{Mt}x_t(m) + B_{Mt}u_M(m) \tag{16}$$
$$y(m) = C_{Mt}x_t(m)$$

where $$A_{Mt}=T^{-1}A^MT;\ B_{Mt}=T^{-1}B_M;\ C_{Mt}=T \tag{17}$$

and the initial condition is $$x_t(0)=T^{-1}x(0) \tag{18}$$

where the elements of $x(0)$ are the coefficients of the initialization polynomial given in Eqn. (11). The CRC is contained in the output vector after the last block of the input sequence has been processed. More precisely, if the input sequence contains N bits with N an integral multiple of M, then the vector $y(N/M)$ contains the CRC. Details are presented below. First, it is important to keep in mind here that, by construction, the input to the transformed state equations (17) is still $u_M(m)$, the input bitstream taken M bits at a time, while the output of these equations is still $y(m)$, which contains the CRC. On the other hand, the state vector $x_t(m)$ does not contain the CRC.

Now, the comment made above with respect to Eqns. (14) is equally applicable to the transformed equations (17); namely that the only computations that must be completed within a time interval constrained by the speed of the communication interface are: (a) the product $A_{Mt}x_t(m)$, and (b) the addition to this product of the result $B_{Mt}u_M(m)$. The point of applying the transformation (15) is that the matrix T can be selected to reduce the complexity of these computations, with the speed-up increased accordingly; in fact, T can be selected so that the complexity of the critical-path computations is reduced to that of the bit-at-a-time equations (7) and full speed-up is achieved. Justification of this statement begins with an examination of the structure of the matrix A used in the bit-at-a-time equations.

The matrix A given in Eqn. (9) has a special form, sometimes referred to as companion form. (Sometimes, the term companion form is used to describe a matrix whose structure is the transpose of that in Eqn. (9).) The elements of the right-hand column are the coefficients of the characteristic polynomial of the matrix, and the submatrix resulting from deletion of the first row and last column of A is an identity matrix. For example, from the discussion associated with Eqns. (7) through (9) we see that the characteristic polynomial of A . in these equations is the CRC generator polynomial G(z). Clearly, any matrix in companion form is completely and uniquely determined by its characteristic polynomial, and so is often referred to as the companion matrix of its characteristic polynomial. In addition, computing the product of an arbitrary companion-form matrix and an arbitrary vector requires at most one addition (i.e., exclusive-or) per element of the result. Therefore, if $A_{mt}$ in Eqns. (17) is in companion form, the critical-path computations are reduced to two exclusive-ors and one shift, which yields full speed-up.

What we want, then, is to find T such that $A_{mt}$ is in companion form. For all cases of interest, where the characteristic polynomial of the original A matrix is useful as a CRC generator polynomial, a matrix T satisfying this condition can always be found. In fact, if M is a power of 2 then T can be selected such that $A_{mt}=A$, which is clearly in companion form. (To have the desired error detection capabilities, a CRC generator polynomial is invariably chosen to be either an irreducible polynomial or the product of and an irreducible polynomial of degree greater than one. Either condition is sufficient for the existence of an appropriate matrix T. Note that each polynomial in Eqn. (2) satisfies one of these conditions.) If M is not a power of 2, it is still possible to select T so that $A_{mt}$ is in companion form. The construction of an appropriate matrix T is based on the following observations:

(1) The relationship between $A^M$ and $A_{Mt}$ in Eqn. (17) has a special form, such that these matrices are referred to as being similar. It is easily shown that similar matrices have the same characteristic polynomial. Thus, $A^M$ and $A_{Mt}$ have the same characteristic polynomial.

(2) If we know the characteristic polynomial of $A^M$, we can immediately construct a matrix in companion form having the same characteristic polynomial. This is a consequence of the structure of a companion-form matrix (see above).

(3) It can be shown (for example, as a corollary of Theorem 5 in Sec. 7.2 of [16]) that if two matrices, say $H_1$ and $H_2$, have the same characteristic polynomial, with this polynomial equal to the minimal polynomial for these matrices, then the two matrices are similar; that is, there exists at least one non-singular matrix T such that $H_2=T^{-1}H_1T$. There is a known technique for finding one or more such matrices, given $H_1$ and $H_2$. (This condition is satisfied for all cases of interest here, given the criteria for a CRC generator polynomial to have useful error detection capabilities.)

In other words, given $A^M$, we can construct a matrix $A_{mt}$ that is similar to $A^M$ and in companion-form, and we can construct a non-singular matrix T that realizes the similarity transformation in Eqn.(17).

We now outline the method being disclosed of achieving full speed-up by M, given M and the CRC generator polynomial G(z). We will then describe an implementation that realizes full speed-up.

IV. A Method for the Present Invention

Given the CRC generator polynomial G(z), of degree K, and M, the number of bits of the input sequence to be processed at a time, the method proceeds as follows:

1. From the polynomial G(z), form the matrix A (Eqn. (9)) and vector b (Eqn. (10)), and then form the matrices $A^M$ and $B_M$ (as described in the text following Eqn. (13)). Note that $B_M$ is given by $$B_M = [b\ Ab\ A^2b\ \ldots\ A^{M-1}b] \tag{19}$$

so that the kth column of $B_M$ is the product $A^{k-1}b$. The computations to obtain $A^M$ and $B_M$ are carried out in GF(2).

2. Find the characteristic polynomial of $A^M$ over GF(2). We will call this polynomial H(z). with $$H(z) = \sum_{k=0}^{K} h_k z^k \tag{20}$$

(A) If M is a power of 2, then the matrix $A^M$ has the same characteristic polynomial as A; in other words, H(z)=G(z). This follows from the well-known Cayley-Hamilton Theorem (that a matrix satisfies its characteristic polynomial) and the fact that if f(z) is a polynomial over GF(2), then $f(z^2)=[f(z)]^2$.

(B) If M is not a power of 2, H(z) can be found in a straightforward way using a computer. First, find the characteristic polynomial of AM using "ordinary arithmetic", i.e., over the real numbers; there are standard tools for this, e.g., the function poly in MATLAB® or the function CHARPOLY in the IBM APL2 MATHFNS workspace. The coefficients of this polynomial evaluated modulo 2 are the coefficients of H(z), i.e., the coefficients of the characteristic polynomial $A^M$ of over GF(2).

3. Form the matrix $A_{Mt}$ as the companion-form matrix whose characteristic polynomial is H(z). That is, $$A = \begin{bmatrix} 0 & 0 & \cdots & 0 & 0 & -h_0 \\ 1 & 0 & \cdots & 0 & 0 & -h_1 \\ 0 & 1 & \cdots & 0 & 0 & -h_2 \\ \cdots & \cdots & \cdots & \cdots & \cdots & \cdots \\ 0 & 0 & \cdots & 1 & 0 & -h_{k-2} \\ 0 & 0 & 0 & 0 & 1 & -h_{k-1} \end{bmatrix} \tag{21}$$

It should be recalled that if M is a power of 2, then $A_{Mt}=A$.

The next steps represent one way of obtaining a matrix T that realizes the similarity transformation between $A_{Mt}$ and $A^M$ in Eqn. (17) (see, for example, Sec. 5–12 in Reference [15]). As noted earlier, this matrix is not unique; i.e., the matrix T constructed in the following steps is not necessarily the only matrix that realizes the desired similarity transformation.

4. Select a constant K×1 matrix $b_1$ over GF(2), and construct the K×K matrix $W_1$ as $$W_1 = [b_1 A_{Mt} b_1 A_{Mt}^2 b_1 \ldots A_{Mt}^{K-1} b_1] \tag{22}$$

Note that the kth column of $W_1$ is the product $A_{Mt}^{k-1}b_1$, computed in GF(2).

(A) If H(z) is irreducible (which is the case for the 32-bit CRC polynomial $G_{32}$, for example), $b_1$ can be any vector other than the all-zero vector.

(B) If is not irreducible (i.e., for which is useful as a CRC polynomial), H(z) will be the product of(z+1) and an irreducible polynomial $H_1(z)$ of degree K−1 (this is the case for the 16-bit CRC polynomial $G_{16}(z)$, for example). In these cases, half of the $2^K$ possible choices for $b_1$ yield a singular matrix for $W_1$ and so are invalid. A necessary and sufficient condition for a particular $b_1$ to yield a non-singular $W_1$ is that the matrix products $H_1(A_{Mt})b_1$ and $(A_{mt}+I_k)b_1$ are both non-zero (i.e., have at least one non-zero element).

5. Select a constant K×I matrix $b_2$ over GF(2), and construct the K×K matrix $W_2$ as $$W_2 = [b_2 A^M b_2 A^{2M} b_2 \ldots A^{(K-1)M} b_2] \tag{23}$$

Here, the kth column of $W_2$ is the product $A^{(k-1)M}b_2$, computed in GF(2).

A. If H(z) is irreducible (which is the case for the 32-bit CRC polynomial G32(z), for example), can be any vector other than the all-zero vector.

B. If H(z) is not irreducible, then for all cases of interest (i.e., for which is useful as a CRC polynomial), H(z) will be the product of (z+1) and an irreducible polynomial $H_1(z)$ of degree K−1 (this is the case for the 16-bit CRC polynomial $G_{16}(z)$, for example). In these cases, half of the $2^K$ possible choices for $b_2$ yield a singular matrix for $W_2$ and so are invalid. A necessary and sufficient condition for a particular $b_2$ to yield a non-singular $W_2$ is that the matrix products $H_1(A^M)b_2$ and $(A^M+I_K)b_2$ are both non-zero (i.e., have at least one non-zero element).

6. Compute $W_1^{-1}$, the inverse of $W_1$, over GF(2). This can be accomplished by first finding the adjoint matrix of $W_1$ using "ordinary arithmetic" over the real numbers, perhaps using standard numerical methods on a computer. The inverse of $W_1$ over GF(2) is then found by evaluating the elements of the adjoint matrix modulo 2.

7. Compute T as the matrix product (in GF(2)):

$$T = W_2 W_1^{-1} \tag{24}$$

8. Compute $T^{-1}$, the inverse of T, over GF(2). The procedure described in step 6 to find $W_1^{-1}$ can be used here as well.

9. Form the matrices $A_{Mt}$, $B_{Mt}$, and $C_{Mt}$, and using Eqn. (17).

At this point, we have what we need to begin the construction of a system that implements the transformed block state equations (16), achieving the full speed-up. Before describing this construction, it is worth looking briefly at an example of the method we have outlined.

Consider the 32-bit CRC defined by the generator polynomial $G_{32}(z)$ given in Eqn. (2), to be computed taking 32 bits of the input sequence at a time (i.e., with M=32). From Eqns. (2), (9), and (10) we have A and $A^M$ for this case given in Eqn. (25) below, as illustrated in FIGS. 2A and 2B. The vector b is equal to the rightmost column of A. With K=M as is the case in this example, $B_M = A^M$. Since M is a power of 2 in this example, H(z) = $G_{32}(z)$ and $A_{Mt}=A$. Now, for simplicity take $$b_1 = b_2 = [100 \ldots 0]^T \tag{26}$$

In this case $W_1$ we find that is the identity matrix, while $W_2$ and its inverse are given in Eqn. (27) below, as illustrated in FIGS. 3A and 3B. Because $W_1$ is the identity matrix, we have that $T=W_2$, $B_{Mt}=W2^{-1}B_M$, and $C_{Mt}=W_2$. Also, it is easy to verify that $W_2 A^M W_2^{-1}$ is equal to A for this example.

V. Implementation of the Present Invention

Implementation of the technique disclosed above is based on pipelining those portions of the computation that are not in the critical timing path. Referring again to Eqns. (16), the steps for each block of M bits of the input sequence and associated block time index m are essentially as follows:

1. Compare $v(m)=B_{Mt}u_M(m)$. This step can be pipelined.
2. Compute the updated state vector $x_t(m+1)$ as $A_{Mtxt}(m)$+ v(m). This step is in the critical timing path.

Figure 4:
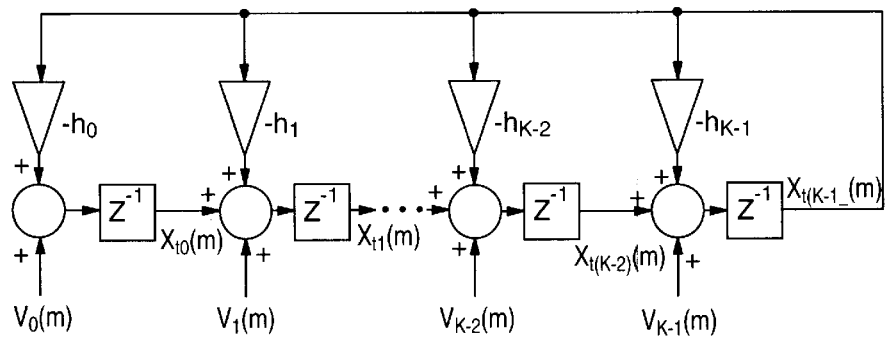
FIG. 4 illustrates a circuit for computing an updated state vector in a transformed state.

3. Compute the current CRC y(m) as $C_{Mt}x_t(m)$. This step can be pipelined. In fact, this step needs to be carried out just once, after the last block of the input sequence has been processed. Details for step 2, analogous to the circuit in FIG. 1, are shown in FIG. 4. Because the arithmetic is modulo 2, the negative signs on the coefficients $h_k$ are superfluous, the coefficients themselves are either 0 or 1 so that the gain elements shown are null functions, and the summing elements provide exclusive-or functions. The identification of the elements of the transformed state vector $x_t$ and the intermediate result v is consistent with that employed earlier; i.e., $$x_t(m)=[x_{t0}(m)x_{t1}(m) \ldots x_{t(K-1)}(m)]^T$$

$$v(m)=[v_0(m) \ldots v_{K-1}(m)]^T \qquad (28)$$

The pipelining of steps 1 and 3 above is a simple matter of breaking the computations into stages, with the computation in each stage limited to what can be completed within M input bit times. In cases with maximum throughput, this limit is equivalent to two exclusive-or operations plus a register. Thus, between registers in the pipeline each stage is limited to the modulo-2 sum of three quantities (assuming two-input exclusive-or gates). Let $L_B$ be the number of stages required for the computation of $B_{Mt}u_M(m)$ in step 1, and let $L_C$ be the number of stages required for the computation of $C_{Mt}x_t(m)$ in step 3. In addition, let $D_B$ be the maximum number of 1s in any row of $B_{Mt}$, and let $D_C$ be the maximum number of 1s in any row of $C_{Mt}$. It is easy to see that $L_B$ need never be greater than $((D_B-1)/2)$, and that $L_C$ need never be greater than $((D_C-1)/2)$, where ceil (x) is the smallest integer greater than or equal to x. These upper bounds correspond to an implementation providing maximum throughput using two-input exclusive-or gates with no grouping of terms. For the example above, we find that $D_B=22$ and $D_C=21$, so that the upper bound for $L_B$ is 11 while that for $L_C$ is 10.

Figure 5:
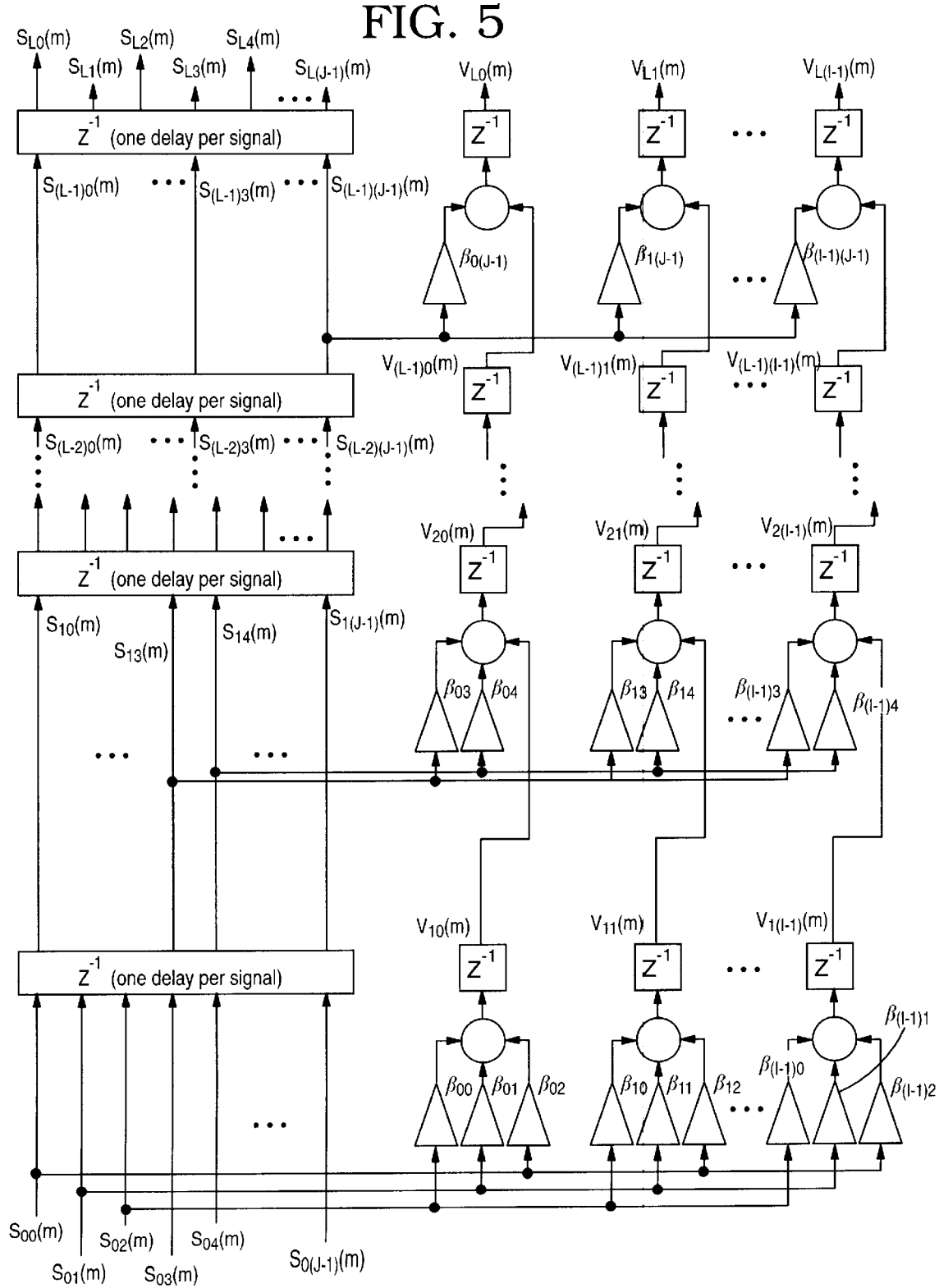
FIG. 5 illustrates a block diagram of a pipelined matrix multiplication circuit.

FIG. 5 shows a block diagram of a pipelined matrix multiplication that can be used as a basis for implementing the computations in steps 1 and 3 above. As was the case for the circuits in the earlier figures, the arithmetic operations in FIG. 5 are shown as generic multiplications and additions rather than the specific equivalent in GF(2). There are L pipeline stages in the figure, with each stage consisting of operations that reduce in GF(2) to two exclusive-ors and a shift, as described above. It is assumed for purposes of using the figure as a reference that all the entries in the matrix are non- zero, so that with a IxJ matrix we have l=CEIL ((j−1)/2). The input vector in the figure is denoted by $$s_0(m)=[s_{00}(m) \ldots s_{0(J-1)}(m)]^T \qquad (29)$$

while the output vector is denoted by $$v_L(m)=[v_{L0}(m)v_{L1}(m) \ldots v_{L(I-1)}(m)]^T \qquad (30)$$

The elements of the matrix are $\beta_{ij}$, with $i=0, \ldots, I-1$ and $j=0, \ldots, J-1$. Taking into account the delay through the pipeline, the matrix product is written as $$v_{Li}(m) = \sum_{j=1}^{J-1} \beta_{ij}s_{0j}(m-L); \quad i=0, \ldots, I-1 \qquad (31)$$

Because of the pipelining, the output at time m depends on the input L sample-times earlier (where a sample is a vector of length M, so that in the context of the CRC computation a sample-time is equal to M bit-times).

As shown in the figure, the output of the Ith stage of the pipeline is $$v_l(m)=[v_{l0}(m)v_{l1}(m) \ldots v_{l(I-1)}(m)]^T; l=1, \ldots, L \qquad (32)$$

while the delayed input vector at the output of the Ith stage of the pipeline is $$s_l(m)=[s_{l0}(m)s_{l1}(m) \ldots s_{l(J-1)}(m)]^T; l=1, \ldots, L \qquad (33)$$

Note also that $$s_l(m)=s_{l-1}(m-1)=s_0(m-1); l=1, \ldots, L \qquad (34)$$

The particular partitioning of the matrix-product computation in Eqn. (31) that is shown in FIG. 5 can be written in the following way:

$$v_{li}(m+1)=\beta_{i0}s_{00}(m)+\beta_{i1}s_{01}(m)\beta_{12}s_{02}(m); i=0, \ldots, I-1$$

$$v_{li}(m+1)=\beta_{i(2l-1)}s_{l-1(2l-1)}(m)+\beta_{i(2l)}s_{(l-1)(2l)}(m)+v_{l-1)i}(m); i=0, \ldots, I-1; l=2, \ldots, L-1$$

$$v_{Li}(m+1)=\beta_{i(J-1)}s_{(L-1)(J-1)}(m)+v_{(L-1)i}(m); i=0, \ldots, I-1 \qquad (35)$$

This partition is consistent with the bound on the amount of work that can be performed per clock cycle (or M bit-times). The presence of only a single addition in the Lth stage results from taking J to be even (which is usually the case), so that L=J/2. Clearly, there are many other ways of partitioning the computation in Eqn. (31) that meet the bound on work per clock cycle. Indeed, we noted above that the number of stages required in the application of interest is limited by the number of non-zero elements in each row of the matrix and may be reduced further by grouping of terms. However, the configuration in FIG. 5 and its representation in Eqns. (35) represent a useful way to describe in general how the pipelining works for the cases of interest here.

That Eqns. (35) are equivalent to Eqn. (31) can be seen by inspection of FIG. 5 or by substitution using Eqn. (34). For example, we can write $$v_{Li}(m) = \beta_{i(J-1)}s_{0(J_j-1)}(m-L) + v_{L-1)i}(m)$$

$$= \beta_{i(J-1)}s_{0(J_j-1)}(m-L) + \beta_{i(J-2)}s_{0(J-2)}(m-L) +$$

$$\beta_{i(J-3)}s_{0(J-3)}(m-L) = v_{L-2)i}(m)$$

$$= \ldots$$

given that for the configuration in FIG. 5 we have L=J/2.

The computations required for steps 1 and 3 above are easily mapped onto the structure just described:

(1) For step 1, we had $v(m)=B_{Mt}u_M$. Given the pipeline delay, this now becomes $v(m)=B_{Mt}u_M(m-L_B)$, and we can make the following identifications: $s_0(m)=u_M(m)$, $v_L(m)=v(m)$, I=K, J=M, $L=L_B$, and $\beta_{ij}$ is the ijth element of $B_{Mt}$. We can also identify the delayed input sequence as $s_L(m)=u_M(m-L_B)$ (2) For step 3, we had $y(m)=C_{Mt}x_t(m)$. Given the pipeline delay, we write this instead as $y(m+L_C)=C_{Mt}x_t(m)$, and we can make the following identifications: $s_0(m)=x_t(m)$, $v_L(m)=y(m)$, I=K, J=K, $L=L_C$, and $\beta_{ij}$ is the ijth element of $C_{Mt}$.

It is now helpful (although not necessary) to rewrite the transformed state equations (16) taking the pipeline delays explicitly into account. These equations become $$x_t(m+1) = A_{Mt}x_t(m) + B_{Mt}u_M(m - L_B) \quad (37)$$
$$y(m + L_C) = C_{Mt}x_t(m)$$

If we keep the time origin relative to the input sequence $u_M(m)$, i.e., with the input starting at m=0, then we need to shift the initial condition for the state vector to $x_t(m)$ to $m=L_B$. In other words, the initial condition now becomes $$x_t(L_B) = T^{-1}x(0) \quad (38)$$

where the elements of x(0) are the coefficients of the initialization polynomial given in Eqn. (11). The CRC is now contained in the output vector y(m) at $m=(N/M)+L_B+L_C$.

Of course, it should be remembered that for arithmetic in GF(2) the coefficients in FIG. 5 are all either 1 or 0, and so the gain elements are in fact either closed paths or open circuits.

Figure 6:
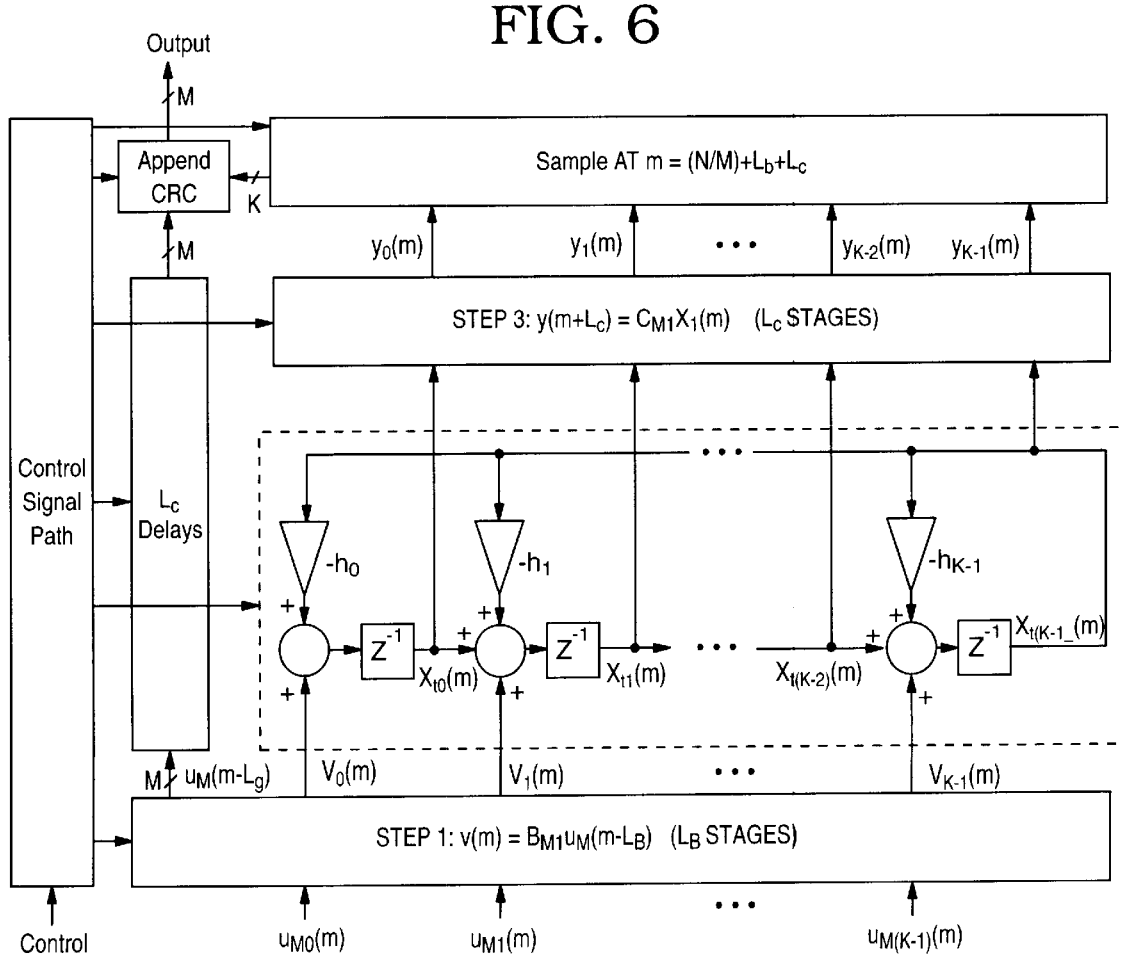
FIG. 6 illustrates a system diagram for computing the CRC with full speed-up.

FIG. 6 shows a block diagram of a system that implements the technique disclosed here for CRC computation. The dashed box encloses the core section (from FIG. 4) that updates the transformed state vector. The blocks that implement the pipelined computations for steps 1 and 3 can be constructed using the configuration in FIG. 5 as a prototype, given the discussion above. The time reference in FIG. 6 is consistent with the input sequence $u_M(m)$ beginning at m=0 as in Eqns. (37) and (38). The figure also includes a parallel path (on the left) that is used to propagate the input data sequence, in blocks of length M as $u_M(m)$, through a number of delays equal to that through the three steps of CRC computation. The $L_B$ delays associated with step 1 are provided within the pipelined matrix multiplication for this step.

Figure 7:
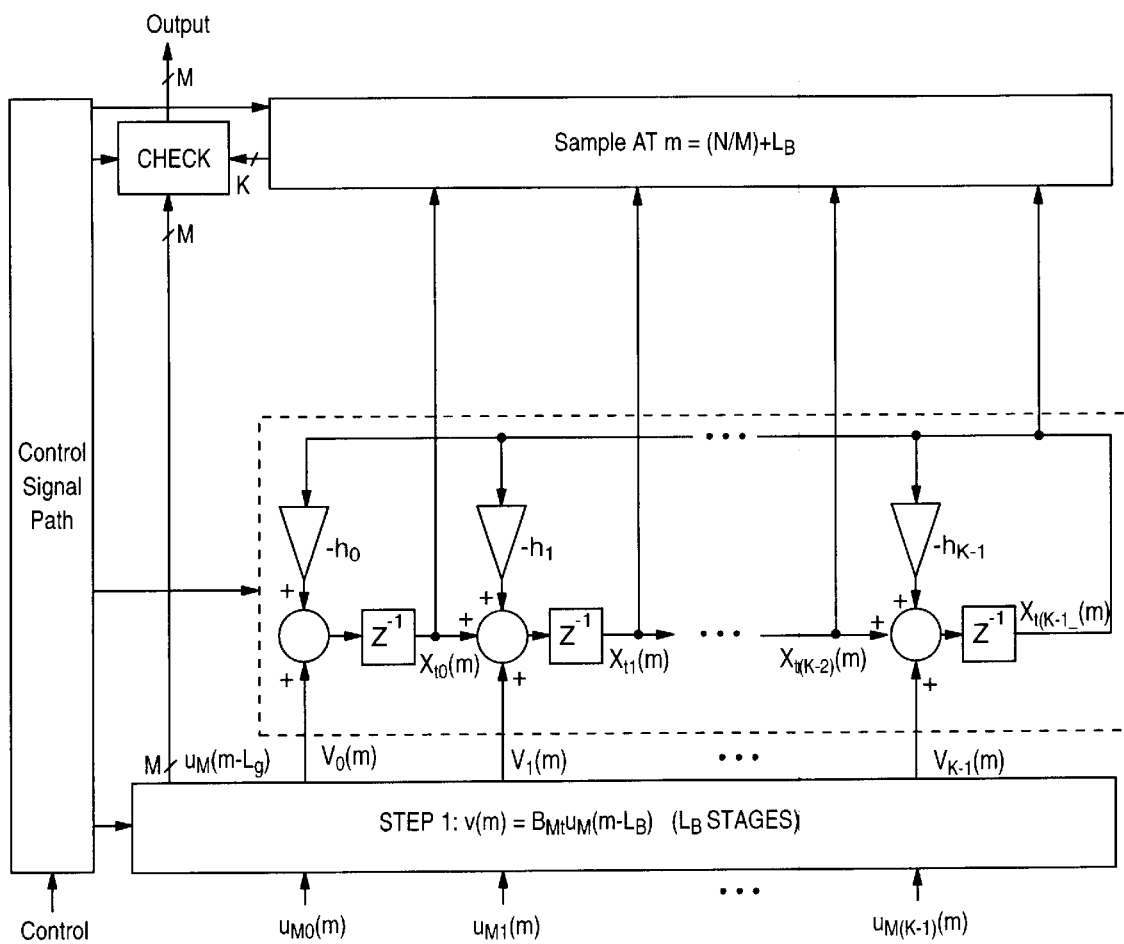
FIG. 7 illustrates a system diagram for computing the CRC with full speed-up specifically in the receive direction.

The $L_C$ delays associated with step 3 are provided by a separate block as shown in the figure. In the receive direction, however, step 3 can be eliminated. The reason is as follows. In the standard approach, the true CRC value is checked with the a priori known value, which can be called $y_0$ for purpose of discussion. The output of the block labeled step 3 would be checked against $y_0$ when the last bits of the received data frame have been processed. By the second line of equation (37), this output satisfies $y(m+L_C)=C_{Mt}x_t(m)$. Because $y_0$ and $C_{Mt}$ are both known a priori, then $C_{Mt}^{-1} y_0$ is the inverse of $C_{Mt}$, or $y_{0t}$. Checking the final output y against $y_0$ is exactly equivalent to checking the final transformed state vector $x_t$ against $y_{0t}$. FIG. 7 illustrates a block diagram of a system that implements the technique disclosed here for CRC computation specifically in the receive direction.

Given these delays, when the CRC is obtained by sampling y(m) at $m=(N/M)+L_B+L_C$, it is aligned in time with the end of the delayed input data. (In fact, the precise alignment desired, and thus the net delay needed for the input sequence, will depend on implementation details associated with appending or checking the CRC.) For data about to be transmitted, the CRC is appended to the input data sequence. (In fact, it is the ones complement of the CRC that is appended to the data sequence before transmission. The ones complementing operation is trivial and is not indicated in the figure.) For data being received, according to the preferred embodiment, the contents of the state vector are compared with the transformed version of a reference specified value (see the definition in [1]); if the result is not correct, the received data sequence is discarded or marked as being in error before being passed to the receiving entity. For convenience, FIG. 6 shows the delayed received data as an M-wide signal and the output of the CRC process sampled at $m=(N/M)+L_B+L_C$ as a K-wide signal.

The figure also shows a block that distributes control and clock signals to the various computation blocks. Appropriate delays would be provided in this block for the control and clock signals. For example, it is assumed that the arrival of the final M-bit block of the input data sequence can be detected, with a corresponding signal propagated up through the appropriate delays so that the time index m=N/M, relative to the first block of the input data, is identified for sampling of the CRC register and for reinitializing the state vector at the appropriate times. Details of these functions are straightforward and so are not shown.

A few comments regarding the complexity of the circuits in FIG. 6 are in order at this point. First, as we noted above, the computation in step 3 is needed only at just after the last block of the input sequence has been processed. In other words, the associated block in FIG. 6 (computation of $C_{Mt}x_t(m)$) needs to be clocked only once the last block of the input data sequence has been processed through the updating of the transformed state vector. Moreover, this computation can be combined with the postprocessing described in the companion patent document to handle cases where N is not an integral multiple of M. Second, while we have shown a generic pipelined matrix multiplication circuit and quoted an upper bound on the pipeline stages needed for steps 1 and 3, the actual number of stages required can be made significantly smaller. One approach is to combine terms using an exclusive-or tree, for example as described in Refs. [8] and [10]. Another approach is to search for vectors $b_1$ and $b_2$ that, when used in steps 4 and 5 above (under the method section), yield matrices $B_{Mt}$ and $C_{Mt}$ with smaller values of $D_B$ and $D_C$, respectively. In addition, there are a variety of trade-offs that can be made between circuit speed, achievable throughput, and the number of pipeline stages required. Techniques such as these that can reduce the complexity of the circuits in FIG. 6 are interesting because they can enhance the value of the invention disclosed here. However, we do not consider them in detail because they are well known and do not contribute to the novelty of what we have disclosed.

VI. Noted Applications of the Present Invention

The method described above is oriented towards hardware implementations that maximize throughput for use with high-speed communication interfaces.

Two possible modes of operation of the implementation shown in FIG. 6 that were not discussed above are worth mentioning briefly, as follows:

(1) Multichannel operation: For certain types of communication interfaces (e.g. those that employ time-division multiplexing), portions of data frames from several different independent sources may be interleaved in time. The CRC computation circuitry used with such interfaces should be capable of being time-shared, i.e., it should be possible to save and restore the state associated with the accumulated CRC of a partially processed data frame. Most known techniques for CRC computation possess this capability. The technique disclosed here also possesses this capability. It should be noted, however, that for the technique disclosed here the system state that must be saved includes the contents of all the pipeline registers (see FIGS. 5 and 6) as well as the state vector. In addition, adding multichannel capability will reduce the maximum throughput (as it would for known techniques as well).

(2) Programmability: A programmable CRC computation technique is one for which the generator polynomial can set by dynamic configuration or programming. The basic bit-at-a-time CRC computation in FIG. 1 can be modified to be programmable. Known software-based parallel CRC computation techniques are generally table-based (see [6], for example); these are programmable if different tables are available corresponding to different generator polynomials. Known hardware-based parallel CRC computation techniques tend to achieve speed-up by combining terms in the block state equations (13) and implementing the equations thus simplified with exclusive-or trees (see [8], for example). Because the optimum simplification will in all likelihood be different for different generator polynomials, a programmable hardware-based implementation using known techniques would require a separate exclusive-or array for each generator polynomial to be supported. In contrast, the technique being disclosed achieves speed-up even with the fully generic structures in FIGS. 4 and 5. The coefficients in these structures ($h_k$ in FIG. 4, and $\beta_{ij}$ in FIG. 5) can be configured dynamically, so long as they have been precomputed off-line and stored for all the generator polynomials of interest. In GF(2), each coefficient is either 0 or 1, so that the programmable gain elements can be implemented simply, for example using transmission gates controlled by the coefficients.

While the invention has been particularly shown and described with reference to preferred embodiments thereof, it will be understood by those skilled in the relevant art that various changes in form and details may be made therein without departing from the spirit and scope of the invention.

What is claimed is:

1. A method for computing a cyclic redundancy check (CRC) code of a communication data stream taking a number of bits M at a time to achieve a throughput equaling M times that of a bit-at-a-time CRC computation operating at a same circuit clock speed, comprising:
   (i) representing a frame of said data stream to be protected as a polynomial input sequence;
   (ii) determining one or more matrices and vectors relating said polynomial input sequence to a state vector; and
   (iii) applying a linear transform matrix for said polynomial input sequence to obtain a transformed version of said state vector.

2. The method according to claim 1, further comprising:
   (iv) applying a linear transform matrix to said transformed version of said state vector to determine a CRC for said polynomial input sequence, if said communication data stream is received by a network device.

3. The method according to claim 2, further comprising:
   (v) appending said CRC as a frame check sequence (FCS) to said communication data stream for detection by a receiving device.

4. The method according to claim 1, wherein said polynomial input sequence u(n) is defined in the field of integers modulo 2 (GF(2)), and said steps (i)–(v) are performed in GF(2).

5. The method according to claim 1, wherein step (i) further comprises:
   grouping the elements of said input sequence into blocks of length M; and
   representing said input sequences in a block oriented fashion as $$u_M(m_{max}) = [u(mM+M-1)\ u(mM+M-2)\ \ldots\ u(mM+1)\ u(mM)]^T,$$

wherein m=0, 1, . . . , $m_{max}$, wherein $m_{max}$ equals (N/M)−1.

6. The method according to claim 1, wherein in step (ii), said state vector is represented by $$x(m+1) = A^M\ x(m) + B_M\ u_M(m),$$

wherein A is a K×K matrix containing the coefficients of a CRC generator polynomial,
   wherein K is the dimension of G(z),
   wherein b is a K dimensional vector containing one or more coefficients of a CRC generator polynomial,
   wherein $B_M$ is a K×M matrix whose columns are determined by multiplying b by successively higher powers of A, and
   wherein $u_M(m)$ is a block oriented version of said input sequence.

7. The method according to claim 1, wherein said step (ii) further comprises:
   (a) determining a matrix A and a vector b from a CRC generator polynomial (G(z)) of degree K; and
   (b) determining a matrix $A^M$ and a matrix $B_M$ respectively from said matrix A and said vector b,
      wherein A is a K×K matrix containing the coefficients of the CRC generator polynomial,
      wherein K is the dimension of G(z), wherein b is a K dimensional vector containing one or more coefficients of the CRC generator polynomial, and
      wherein $B_M$ is a K×M matrix whose columns are determined by multiplying b by successively higher powers of A.

8. The method according to claim 7, wherein A equals $$A = \begin{bmatrix} 0 & 0 & \cdots & 0 & 0 & -g_0 \\ 1 & 0 & \cdots & 0 & 0 & -g_1 \\ 0 & 1 & \cdots & 0 & 0 & -g_2 \\ \cdots & \cdots & \cdots & \cdots & \cdots & \cdots \\ 0 & 0 & \cdots & 1 & 0 & -g_{k-2} \\ 0 & 0 & 0 & 0 & 1 & -g_{k-1} \end{bmatrix}$$

where $g_0, g_1, g_2, \ldots g_{k-1}$ are coefficients of the CRC generator polynomial.

9. The method according to claim 7, wherein b equals $[-g_0, -g_1, -g_2, \ldots -g_{K-1}]^T$.

10. The method according to claim 7, wherein $B_M$ equals $[b\ Ab\ A^2b\ \ldots\ A^{M-1}b]$.

11. The method according to claim 7, wherein step (iii) comprises:
   (a) determining a characteristic polynomial H(z) of $A^M$ over the field of integers modulo 2 (GF(2));
   (b) determining a companion-form matrix $A_{Mt}$ whose characteristic polynomial is H(z); and
   (c) calculating said linear transform matrix T for said input sequence from $A^M$ and $A_{Mt}$.

12. The method according to claim 11, further comprising:
   if M is a power of 2, then determining $A^M$ to have the same characteristic polynomial as A, such that H(z) equals G(z); and
   if M is not a power of 2, then calculating H(z) for $A^M$ by applying ordinary arithmetic and determining H(z) to have the coefficients of an interim characteristic polynomial evaluated modulo 2.

13. The method according to claim 11, comprising:
(a) calculating said linear transform matrix T as the product of a matrix $W_2$ and a second matrix $W_1^{-1}$,
wherein $W_1=[b_1\ A_{Mt}b_1\ A_{Mt}^2b_1\ \ldots\ A_{Mt}^{K-1}b_1]$,
wherein $W_2=[b_2\ A_{Mt}b_2\ A_{Mt}^2b_2\ \ldots\ A^{(K-1)M}b_2]$,
wherein if $H(z)$ is irreducible, then $b_1$, can equal any vector other than the all-zero vector,
wherein if $H(z)$ is not irreducible, then $b_1$, is derived by the product of $(z+1)$, where z is a transform variable, and an irreducible polynomial $H_1(z)$ of degree K−1, where the matrix products of $H_1(A_{Mt})b_1$ and $(A_{Mt}+I_K)b_1$ are both non-zero in value, where I is an identity K×K dimensional matrix;
wherein if $H(z)$ is irreducible, then $b_2$ can equal any vector other than the all-zero vector, and
wherein if $H(z)$ is not irreducible, then $b_2$ is derived by the product of $(z+1)$ and an irreducible polynomial $H_2(z)$ of degree K−1, where the matrix products of $H_2(A^M)b_2$ and $(A^M+I_K)b_2$ are both non-zero in value; and
(b) computing $W_1^{-1}$ as the inverse of $W_1$ over GF(2).

14. The method according to claim 11, wherein said transformed version of said state vector is defined by the equations
$x_t(m+1)=A_{Mt}\ x_t(m)+B_{Mt}\ u_M(m)$, and $y(m)=C_{Mt}\ x_t(m)$,
wherein m is an integer; and wherein said step (iv) comprises:
determining said CRC by applying the equations $A_{Mt}=T^{-1}\ A^M\ T$, $B_{Mt}=T^{-1}\ B_M$, $C_{Mt}=T$, and the initial condition $x_t(0)=T^{-1}x(0)$ to said transformed version of said state vector until $y(m)$ equals $y(N/M)$, wherein N is the length of said input sequence, and wherein $T^{-1}$ is the transverse of said linear transform matrix T.

15. A system for computing a cyclic redundancy check (CRC) code of a communication data stream taking a number of bits M at a time to achieve a throughput equaling M times that of a bit-at-a-time CRC computation operating at a same circuit clock speed, comprising:
first device that represents a frame of said data stream to be protected as a polynomial input sequence;
second device that determines one or more matrices and vectors relating said polynomial input sequence to a state vector; and
third means that determines one or more matrices and vectors relating said polynomial input sequence to a state vector.

16. The system according to claim 15, further comprising:
fourth device that applies a linear transform matrix to said transformed version of said state vector to determine a CRC for said polynomial input sequence, if said communication data stream is received by a network device.

17. The system according to claim 16, further comprising:
fifth device that appends said CRC as a frame check sequence (FCS) to said communication data stream for detection by a receiving device.

18. The system according to claim 15, wherein said second device further comprises:
device that groups the elements of said input sequence into blocks of length M, and
that represents said input sequences in a block oriented fashion as $u_M(m_{max})=[u(mM+M-1)\ u(mM+M-2)\ \ldots\ u(mM+1)\ u(mM)]^T$, wherein $m=0, 1, \ldots, m_{max}$, wherein $m_{max}$ equals $(N/M)-1$.

19. The system according to claim 15, wherein said second device comprises:
device that calculates said state vector as represented by $x(m+1)=A^M\ x(m)+B_M\ u_M(m)$, wherein A is a K×K matrix containing the coefficients of a CRC generator polynomial,
wherein K is the dimension of $G(z)$,
wherein b is a K dimensional vector containing one or more coefficients of a CRC generator polynomial,
wherein $B_M$ is a K×M matrix whose columns are determined by multiplying b by successively higher powers of A, and
wherein $u_M(m)$ is a block oriented version of said input sequence.

20. The system according to claim 15, wherein said second device further comprises:
device that determines a matrix A and a vector b from a CRC generator polynomial $(G(z))$ of degree K; and
device that determines a matrix $A^M$ and a matrix $B_M$ respectively from said matrix A and said vector b,
wherein A is a K×K matrix containing the coefficients of the CRC generator polynomial,
wherein K is the dimension of $G(z)$, wherein b is a K dimensional vector containing one or more coefficients of the CRC generator polynomial, and
wherein $B_M$ is a K×M matrix whose columns are determined by multiplying b by successively higher powers of A.

21. The system according to claim 20, wherein said third device comprises:
device that determines a characteristic polynomial $H(z)$ of $A^M$ over the field of integers modulo 2 (GF(2));
device that determines a companion-form matrix $A_{Mt}$ whose characteristic polynomial is $H(z)$; and
device that (c) calculates said linear transform matrix T for said input sequence from $A^M$ and $A_{Mt}$.

22. The system according to claim 21, further comprising:
device that determines $A^M$ to have the same characteristic polynomial as A, such that $H(z)$ equals $G(z)$ if M is a power of 2; and
device that calculates $H(z)$ for $A^M$ by applying ordinary arithmetic and determining $H(z)$ to have the coefficients of an interim characteristic polynomial evaluated modulo 2, if M is not a power of 2.

23. The system according to claim 21, comprising:
(a) device that calculates said linear transform matrix T as the product of a matrix $W_2$ and a second matrix $W_1^{-1}$,
wherein $W_1=[b_1\ A_{Mt}b_1\ A_{Mt}^2b_1\ \ldots\ A_{Mt}^{K-1}b_1]$,
wherein $W_2=[b_2\ A^M\ b_2\ A^{2M}b_2\ \ldots\ A^{(K-1)M}b_2]$,
wherein if $H(z)$ is irreducible, then b, can equal any vector other than the all-zero vector,
wherein if $H(z)$ is not irreducible, then b, is derived by the product of $(z+1)$, where z is a transform variable, and an irreducible polynomial $H_1(z)$ of degree K−1, where the matrix products of $H_1(A_{Mt})b_1$ and $(A_{Mt}+I_K)b_1$ are both non-zero in value, where I is an identity K×K dimensional matrix;
wherein if $H(z)$ is irreducible, then $b_2$ can equal any vector other than the all-zero vector, and
wherein if $H(z)$ is not irreducible, then $b_2$ is derived by the product of $(z+1)$ and an irreducible polynomial $H_2(z)$ of degree K−1, where the matrix products of $H_2(A^M)b_2$ and $(A^M+I_K)b_2$ are both non-zero in value; and
(b) device that computes $W_1^{-1}$ as the inverse of $W_1$ over GF(2).

24. The system according to claim 23, wherein said transformed version of said state vector is defined by the equations $x_t(m+1)=A_{Mt}x_t(m)+B_{Mt} u_M(m)$, and $y(m)=C_{Mt} x_t(m)$, wherein m is an integer; and wherein said fourth device comprises:

device that determines said CRC by applying the equations $A_{Mt}=T^{-1} A^M T$, $B_{Mt}=T^{-1} B_M$, $C_{Mt}=T$, and the initial condition $x_t(0)=T^{-1}x(0)$ to said transformed version of said state vector until y(m) equals y(N/M), wherein N is the length of said input sequence, and wherein $T^{-1}$ is the transverse of said linear transform matrix T.

* * * * *